United States Patent [19]

Niswonger

[11] Patent Number: 5,109,455
[45] Date of Patent: Apr. 28, 1992

[54] OPTIC INTERFACE HYBRID

[75] Inventor: Damon A. Niswonger, Lafayette, Ind.

[73] Assignee: CTS Corporation, Elkhart, Ind.

[21] Appl. No.: 562,545

[22] Filed: Aug. 3, 1990

[51] Int. Cl.[5] .............................................. G02B 6/42
[52] U.S. Cl. .................................... 385/94; 357/74
[58] Field of Search ............... 350/96.10, 96.20, 321; 357/74

[56] References Cited

U.S. PATENT DOCUMENTS

| | | | |
|---|---|---|---|
| 3,518,756 | 7/1970 | Bennett et al. | 156/89 |
| 4,788,046 | 11/1988 | Barringer et al. | 423/122 |
| 4,797,728 | 1/1989 | Dholakia et al. | 357/74 |
| 4,799,983 | 1/1989 | Desai | 156/89 |
| 4,806,188 | 2/1989 | Rellick | 156/89 |
| 4,820,659 | 4/1989 | Dholakia et al. | 357/80 |
| 4,836,635 | 6/1989 | De Amorim | 350/96.20 |
| 4,846,930 | 7/1989 | Stanley | 156/633 |
| 4,862,231 | 8/1989 | Abend | 357/74 |
| 4,873,566 | 10/1989 | Hokanson et al. | 357/74 |
| 4,888,625 | 12/1989 | Mueller | 357/75 |
| 4,893,901 | 1/1990 | Taumberger | 350/321 |
| 4,894,707 | 1/1990 | Yamawaki et al. | 357/74 |
| 4,896,936 | 1/1990 | Stanley | 350/96.20 |
| 4,897,711 | 1/1990 | Blonder et al. | 357/74 |
| 4,905,075 | 2/1990 | Temple et al. | 357/74 |
| 4,926,545 | 5/1990 | Pimpinella et al. | 350/96.17 |
| 4,929,965 | 5/1990 | Fuse | 346/107 R |

Primary Examiner—John D. Lee
Assistant Examiner—Phan T. Heartney
Attorney, Agent, or Firm—Albert W. Watkins

[57] ABSTRACT

An optic interface hybrid uses two substrates to achieve precise optical alignment of an optic device with an optical window. The window is formed in the package which hermetically surrounds the substrates and optic device. The inter-engagement of the two substrates provides alignment on three axis without the use of expensive fixturing, equipment, labor, or materials investment.

8 Claims, 6 Drawing Sheets

OPTIC INTERFACE HYBRID

BACKGROUND OF THE INVENTION

1. Field of the Invention

This invention pertains to optical hybrids generally, and specifically to hermetic packaging techniques which allow for precision alignment of optical interfaces without the usual associated elevated expense.

2. Description of the Related Art

Optical devices may either transmit, conduct or receive light energy. The light energy may, for the purposes of this disclosure, be concentrated in the band visible to the human eye, or in regions of both shorter and longer wavelengths.

In present day commerce, the sciences of optics and electronics are often synergistically combined to produce products which have performance characteristics which are uniquely benefited. This combination offers numerous advantages. These products may offer higher operational speeds and increased bandwidths, exemplified by the optical fiber telecommunications industry. Optical links are also much more immune to signal interference caused by stray electro-magnetic waves than are electrical links. Additional advantages which are too numerous to mention may be found in any text on opto-electronics. As a result of the many advantages, there is a desire to incorporate optical devices and systems into traditional electronic packages.

Best performance of individual optical devices in an optical system is generally obtained where a maximum amount of light energy is coupled between transmitter and receiver. A good strong signal generated by a transmitter and efficiently coupled to a receiver will allow for a high signal-to-noise ratio.

This light energy must be coupled in such a way as to not adversely affect the phase relationship of the various waves within the light, in those systems which modulate the light energy at significant frequencies. Additionally, large distances between transmitters, conductors and receivers may provide a source for undesirable reflections or diffusion.

Many designs have been produced which attempt to incorporate the above and other considerations into an optical interface hybrid. Illustrative of the designs is U.S. Pat. No. 4,836,635 to De Amorim. In this design an optical device is mounted inside a package having an optically transparent window. In order to focus the light and reduce the possibility of reflection, a concentrating lens is placed between the optical component and the transparent window. Alignment of the various components is critical and as a result, the package is necessarily complicated and difficult to manufacture. Additional expense is also necessarily incurred by the inclusion of the concentrating lens.

Another common type of opto-electronic package is illustrated in U.S. Pat. No. 4,897,711 to Blonder et al. A package having an alignment hole for optical cable is provided, and a reflector is interposed between the optical cable and the receiving device to provide redirection of the light from the cable to the receiver in a reliable way. However, such a package suffers from the limitation of being very difficult to reliably hermetically seal during production. Where the parts are successfully sealed, delivery to the customer becomes an entire engineering feat in and of itself, because of the "pig-tail" created by the protruding optic cable. In spite of the problems created by the package design, the customer must still incorporate some type of optical coupling to the optical cable. While this type of package design is satisfactory for those applications which do not require hermeticity, the design is inadequate for hermetic packages. U.S. Pat. No. 4,846,930 to Stanley discloses a similar arrangement for a laser diode.

Several packaging schemes provide for coupling from an optical device through an opening or optical window in the package. Illustrative of this concept are U.S. Pat. Nos. 4,929,965 to Fuse and 4,893,901 to Taumberger.

Fuse discloses a hermetic package in which an optical device is mounted and aligned with an optical window. Yet no alignment mechanism is provided to assist in the manufacture of the device. In production, these devices are usually assembled with the provision of a test signal or very expensive, tightly controlled placement tolerance equipment. Additionally, the device is directly attached to the package structure with the adhesive in close proximity to the window, resulting in potential interference between the adhesive component and the optical window. Such susceptibility to adhesive bleed will adversely affect the yield of components which contain a large material investment.

Overcoming many of the adversities of other designs, Taumberger et al incorporate an optical window on a side of the package which is opposite to the optical device. Alignment is less critical, since a variation in the incoming incident angle of the light energy will vary the location on the substrate where the light will be most concentrated. In other words, the package may be tilted slightly relative to the parts of the optical system which are exterior to the package in order to align a relatively columnated beam of light between the optical device within the package, the optical window, and the optical device(s) exterior to the package. However, the Taumberger design is not without material limitations. The additional spacing created between the window and the optical device forces alignment with the outside to be very critical. There are three points which must be brought into alignment—the window, the internal optical component and the external optical component. Additionally, either the package or the external optical device must be adjustable. Adjustment will be generally required after assembly, necessitating extra cost and potentially more elaborate mounting for the package or the external device.

SUMMARY OF THE INVENTION

The present invention overcomes the limitations of the prior art through the use of a first substrate connected on a first side to a package and on a second side carrying active electronic components, the package having an optical window which is in close proximity to an opening formed in the first substrate, an optical device mounted upon a second substrate and electrically connected thereto, the second substrate mounted within the opening formed in the first substrate and electrically connected thereto and oriented so that said optical device is in close proximity to said window.

The package is designed so as to be fully hermetic. No special alignment is required because of the relative proximity of the optical device to the optical window and all tolerances are within reasonable manufacturing tolerance ranges.

BRIEF DESCRIPTION OF THE DRAWINGS

FIG. 5 illustrates the B side of the detector tab, substrate cavity and package window by exploded view.

DESCRIPTION OF THE PREFERRED EMBODIMENT

Figure 1:
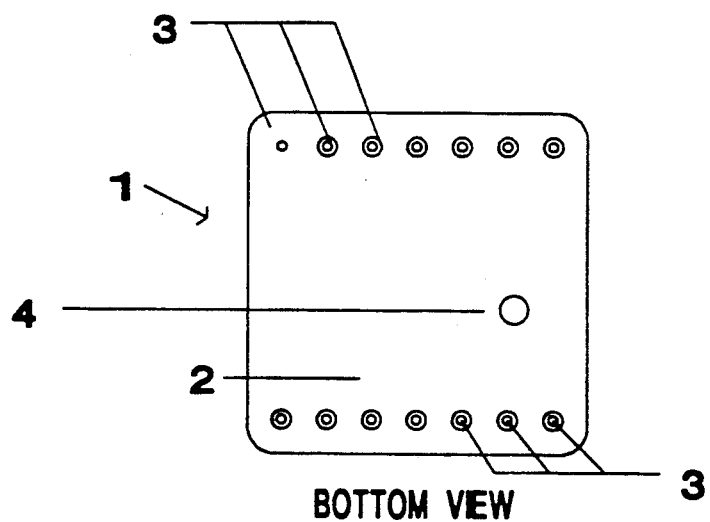
FIG. 1 shows an external bottom view of a package assembled in accord with the preferred embodiment of the invention.

Referring now to FIG. 1, the exterior of a device 1 assembled in accord with the preferred embodiment of this invention is illustrated. The device 1 includes a generally referenced package 2 which might typically be fabricated from Kovar or other suitable material. Protruding from package 2 are a variety of electrical terminals 3 which may be used to connect electrical signals between the package 2 and some external circuit. A small optical window 4 is included, which might consist of a sealing glass or plug which is optically transparent or translucent to light at wavelengths of interest.

Figure 2:
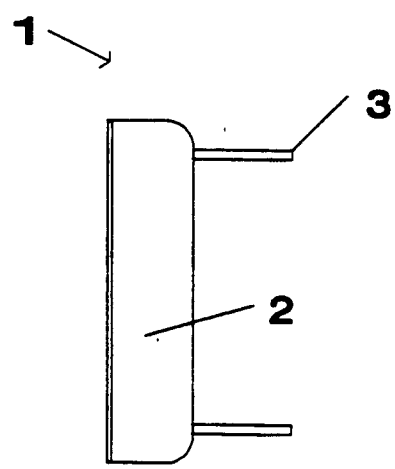
FIG. 2 shows an external side view of the package of figure 1.

By side view in FIG. 2, the protruding terminals 3 are apparent, as well as the generally planar nature of the package 1 opposite protruding terminals 3.

Figure 3:
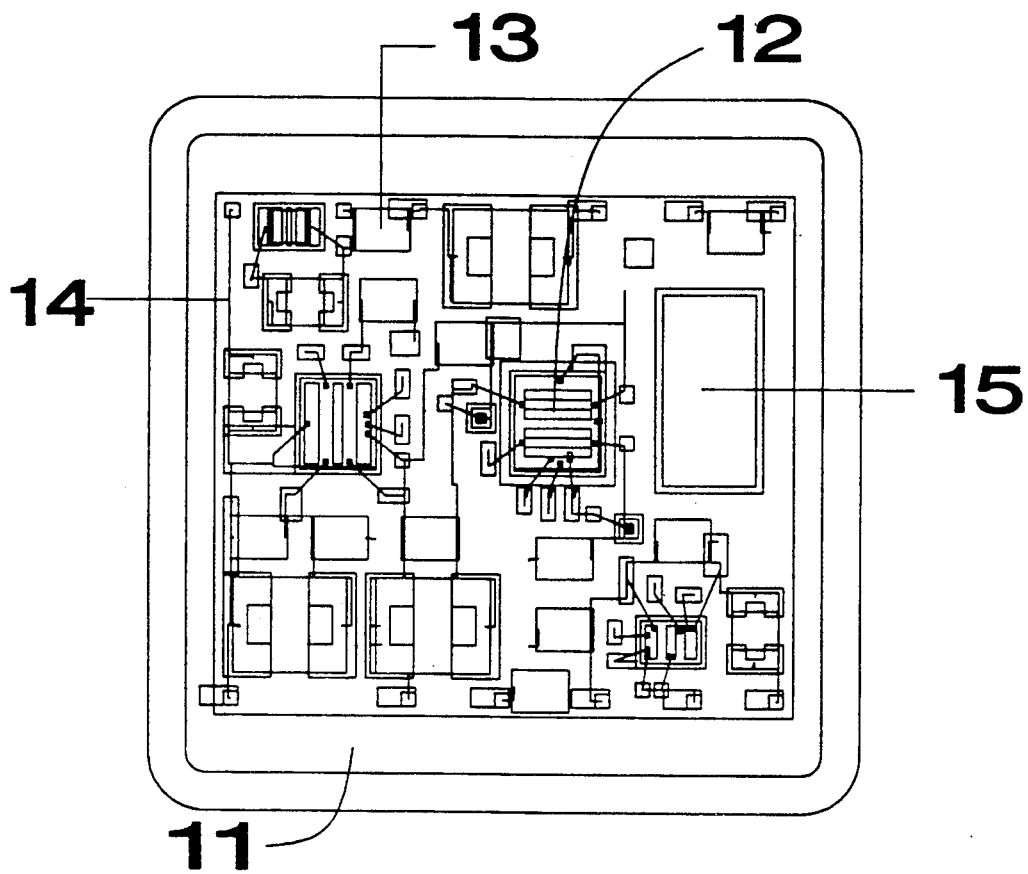
FIG. 3 illustrates an exemplary primary substrate populated with various electrical and electronic devices, and incorporating a detector tab in accord with the preferred embodiment.

In FIG. 3, a typical electronic hybrid substrate is illustrated. The hybrid substrate 11 includes a variety of active 12 and passive 13 electronic and electrical components and appropriate interconnections 14. Only a few of these components have been numbered for sake of brevity. These components 12-14 would preferably include all associated circuitry necessary to operate the optical device, though certainly other variations of circuitry are possible as the designer might desire. This hybrid substrate 11 is preferably be produced from multi-layer glass-ceramic tapes which have various circuit interconnections imprinted thereon. In production, a circuit pattern is formed, typically by screen printing, upon a surface of this glass-ceramic tape. Other circuit patterns are formed upon other surfaces of the tape. Once each of the circuit patterns are formed, the sections of tape are layered one on top of another in carefully controlled registration. The tape composite is then fired at elevated temperatures to produce a finished hybrid substrate of rigid mechanical construction which through the multiple layers carries all of the appropriate interconnections. Any holes in the substrate which might be required in later assembly are punched prior to firing.

Examples of this process of substrate manufacture may be found in U.S. Pat. Nos. 4,806,188, 4,799,984, 4,788,046, or 3,518,756, incorporated herein by reference.

The electrical components are then electrically mounted upon the hybrid substrate 11. In addition to the electrical components, there is a second substrate, the detector substrate 15, which must be mounted. In FIG. 3 the B or back side of detector substrate 15 is visible. The detector substrate 15 may be bonded by conductive epoxy to hybrid substrate 11, though other convenient means may be used.

Figure 4:
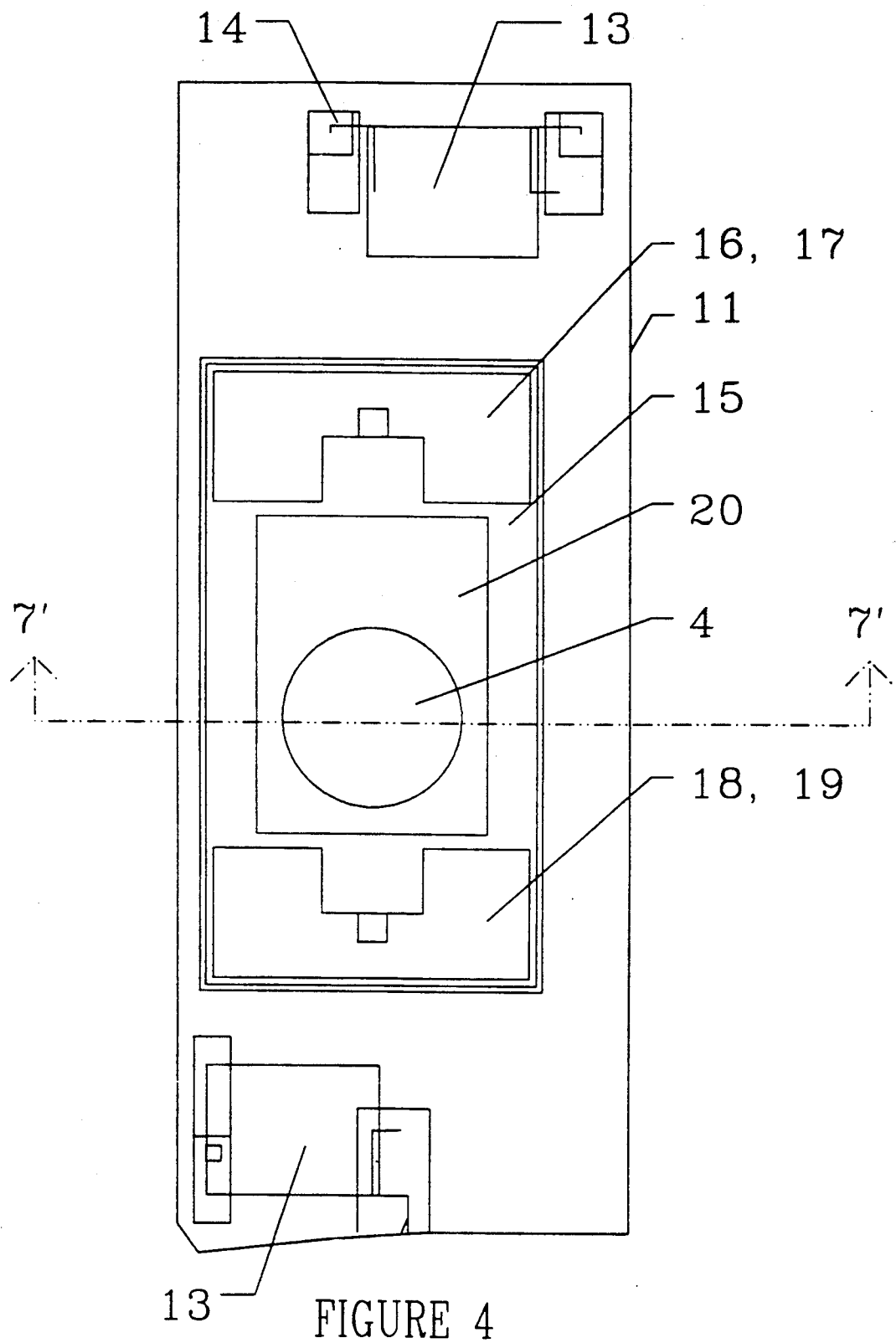
FIG. 4 illustrates an enlarged view of the detector substrate 15.
Figure 4:
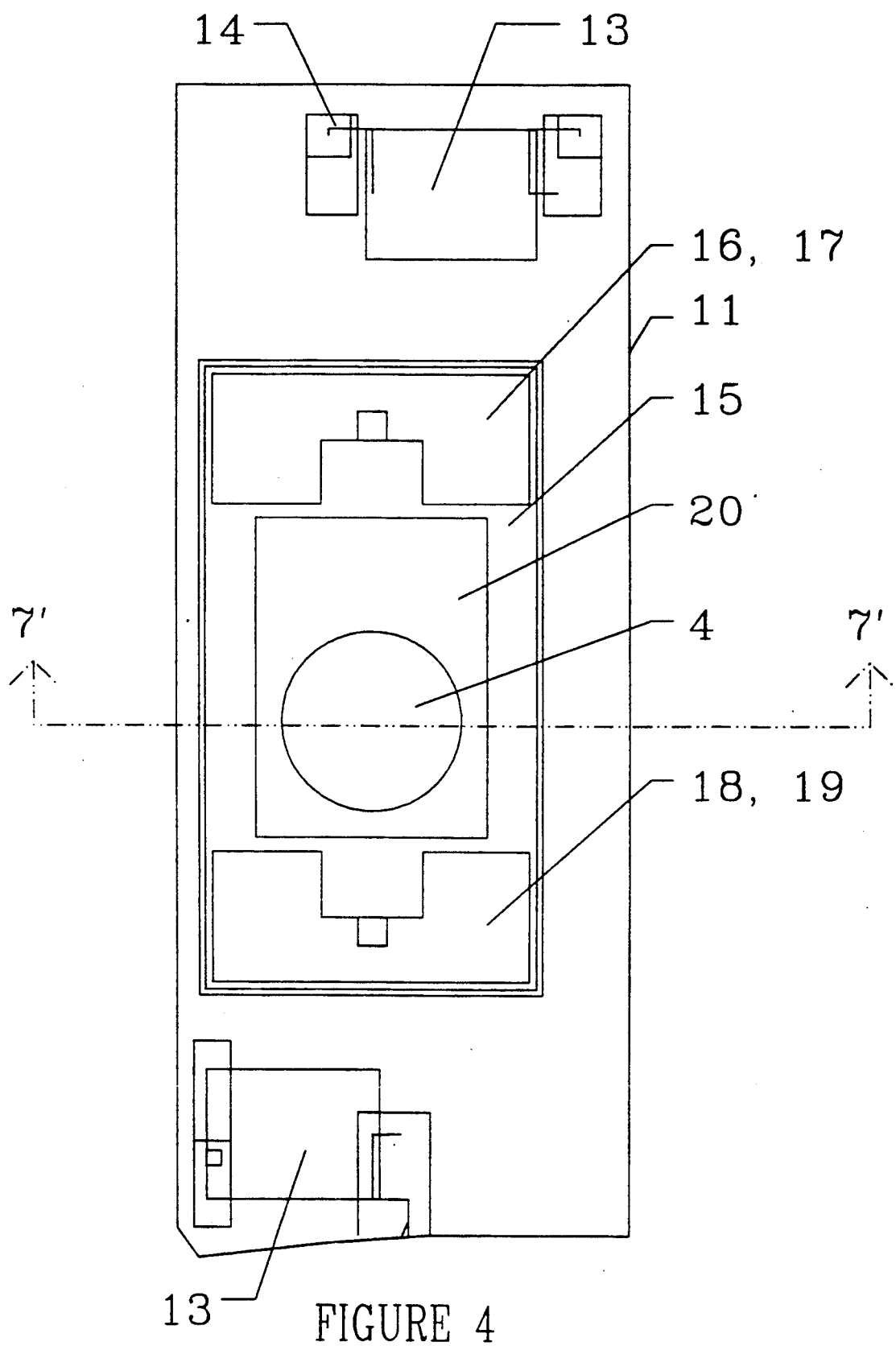
Figure 6:
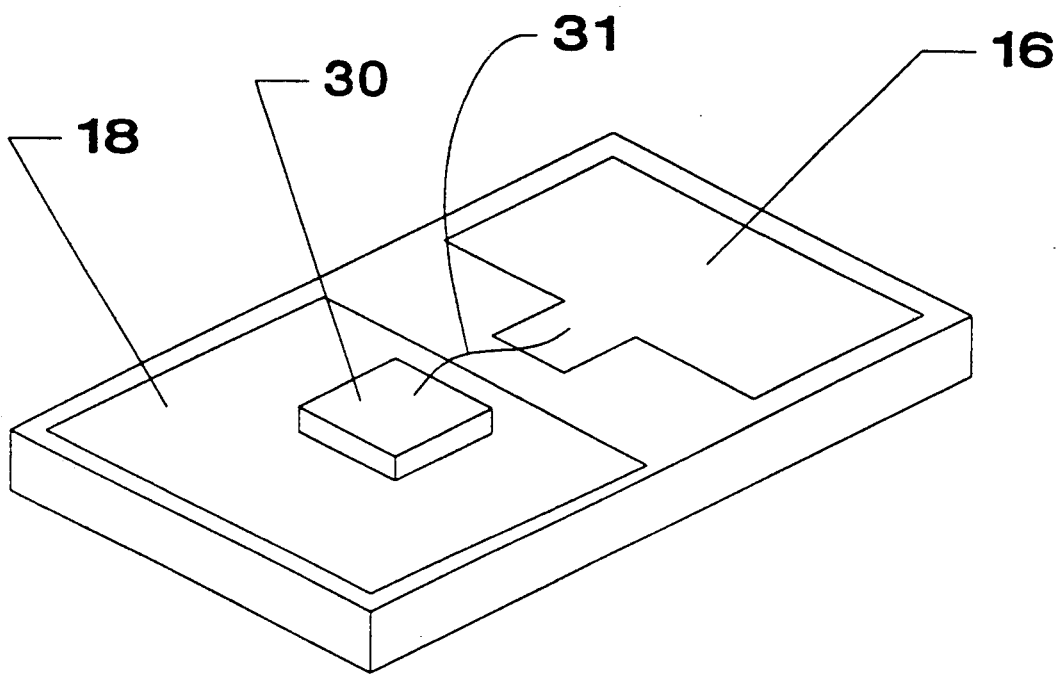
FIG. 6 illustrates the A side of the detector tab.
Figure 7:
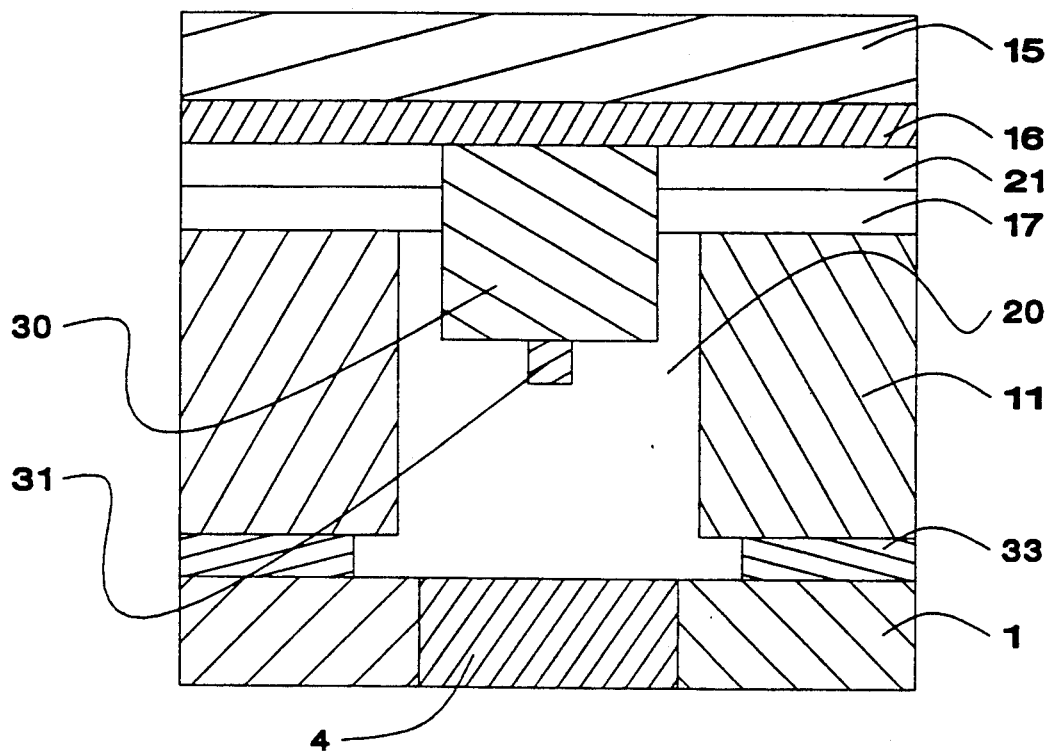
FIG. 7 is a cross-section of FIG. 4 taken along line 7'.

A better description of the detector substrate 15 may be gained by referring now to FIGS. 4-7, where identical components have been so numbered. In FIG. 4, the B side of the detector substrate 15 is illustrated in enlarged form from previous fi u 3, and some invisible lines have been included (some invisible lines excluded). FIG. 7 is a cross-sectional view of FIG. 4 taken along line 7'. FIG. 5 is an exploded view of the assembly shown in FIG. 4, and FIG. 6 illustrates the A side of detector substrate 15. Passive components 13 mounted upon and interconnections 14 formed upon the hybrid substrate 11 are still visible in FIG. 4. Additionally, epoxy attach pads 16, 17, 18, and 19 have been formed upon both the detector and hybrid substrates in similar dimension. The attach pads provide both electrical interconnection between detector substrate 15 and hybrid substrate 11, and also mechanical adhesion through the use of bonding and electrically conductive epoxy 21. Epoxy 21 may be any one of a large variety of commercially available silver filled epoxy compounds. Passing entirely through hybrid substrate 11 is a cavity 20, and through package 1 a small window 4. Cavity 20 and window 4 form the optical pathway between photo-diode 30 and the exterior of package 1.

In practice, the hybrid substrate 11 may be bonded to package 1 through the use of an epoxy preform 33. The epoxy preform 33 is illustrated in FIG. 7 to extend virtually into the cavity 20. However, in practice, the preform would likely end a substantial distance away from the window to prevent any possible bleeding of the epoxy into the optical pathway.

Visible best in FIG. 6, photo-diode 30 is wire-bonded by means of a small wire, typically gold of 0.001" to 0.002" diameter, to epoxy attach pad 16, while being bonded via conductive epoxy or other conductive bonding material to epoxy attach pad 18.

Visible best in FIG. 5, the hybrid substrate 11 has been formed from several layers of the fired glass-ceramic tape. Epoxy attach pads 17 and 19 extend out on a sort of ledge 32 which is created by punching a smaller rectangular opening in three of the layers of tape (to form window 20) than in the fourth layer of tape. The detector substrate is sized to be very close to, although a minute fraction smaller than the opening punched in the fourth layer of tape. The detector substrate may be of any suitable thickness, though even a thickness exactly matching the thickness of the fourth layer should be acceptable.

By packaging an optical device according to the present invention, very tight tolerances on the distances between the optical device and the package window may be attained based upon the fired thickness of the tape layers. This is due to the very predictable shrinkage which occurs within the glass-ceramic tape upon firing. The alignment between the hybrid substrate and the package is necessarily very precise, and yet easily attainable, because of the protruding terminals 3. Additionally, the formation of the cavity 20 and ledge 32 is readily accomplished with precision using punching dies during punching of vias in the tape. As a result of this novel arrangement, very standard techniques and equipment may be used to assemble a hermetic optic interface hybrid without significant assembly, fixturing, or yield loss, while still attaining a very precise optical package.

While the present invention has been disclosed in the preferred embodiment as being formed using glass-ceramic tape, the use of appropriately formed ceramics, plastics, or other substrate materials could be readily accomplished by one of ordinary skill in the art who possess the present disclosure. However, the invention is believed to be best practiced through the use of the glass-ceramic tape.

While the foregoing details what is felt to be the preferred embodiment of the invention, no material limitations to the scope of the claimed invention is intended. Further, features and design alternatives which would be obvious to one of ordinary skill in the art are considered to be incorporated herein. The scope of the invention is set forth and particularly described in the claims hereinbelow.

I claim:

1. An optic interface hybrid comprising:
    a hybrid substrate connected on a first side to a package and on a second side carrying electronic components;
    said package having an optical window which is in close proximity to an opening formed in said hybrid substrate;
    an optical device mounted upon a second substrate and electrically connected thereto;
    said second substrate mounted within said opening formed in said hybrid substrate and electrically connected thereto, said second substrate oriented so that said optical device is in close proximity to said window and has an optical path to the exterior of said package formed at least in part by said window.

2. The optic interface hybrid of claim 1 wherein said package is at least a part of a hermetic seal around said substrates and said optic device.

3. The optic interface hybrid of claim 1 wherein said package contains both active and passive electronic components.

4. The optic interface hybrid of claim 1 wherein said hybrid substrate is comprised by a multi-layer composition having electrical interconnections on more than one layer.

5. The optic interface hybrid of claim 4 wherein said multi-layer composition is comprised by a glass-ceramic material.

6. The optic interface hybrid of claim 4 wherein said hybrid substrate has a first layer having a first layer opening therein, and wherein said hybrid substrate has a second layer, said second layer carrying said electronic components and having a second layer opening therein, said hybrid substrate opening comprising both of said first and second layer openings, said second substrate mounted at least partially within said second layer opening, said first layer opening being of insufficient dimension for said second substrate to be mounted therein.

7. The optic interface hybrid of claim 6 wherein said first layer comprises electrical connections exposed to said second substrate suitable for electrical interconnection thereto, whereby said second substrate may be in electrical communication with said hybrid substrate via said first layer electrical connections.

8. The optic interface hybrid of claim 6 wherein said optical device extends into said first layer opening.

* * * * *